United States Patent
Sorenson et al.

(10) Patent No.: US 10,914,585 B1
(45) Date of Patent: Feb. 9, 2021

(54) HIGH DYNAMIC RANGE GYROSCOPE

(71) Applicant: HRL LABORATORIES, LLC, Malibu, CA (US)

(72) Inventors: Logan D. Sorenson, Agoura Hills, CA (US); Raviv Perahia, Agoura Hills, CA (US); David T. Chang, Calabasas, CA (US); Randall L. Kubena, Oak Park, CA (US); Deborah J. Kirby, Calabasas, CA (US); Hung Nguyen, Los Angeles, CA (US); Richard J. Joyce, Thousand Oaks, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 16/871,497

(22) Filed: May 11, 2020

Related U.S. Application Data

(62) Division of application No. 16/277,610, filed on Feb. 15, 2019, now Pat. No. 10,697,772, which is a division of application No. 15/253,694, filed on Aug. 31, 2016, now Pat. No. 10,444,014.

(60) Provisional application No. 62/321,042, filed on Apr. 11, 2016, provisional application No. 62/212,902, filed on Sep. 1, 2015.

(51) Int. Cl.
*G01C 19/5726* (2012.01)
*G01C 19/5755* (2012.01)

(52) U.S. Cl.
CPC ..... *G01C 19/5726* (2013.01); *G01C 19/5755* (2013.01)

(58) Field of Classification Search
None
See application file for complete search history.

(56) References Cited

U.S. PATENT DOCUMENTS

| | | | |
|---|---|---|---|
| 4,675,820 A * | 6/1987 | Smith | G01C 21/16 701/501 |
| 6,806,784 B2 | 10/2004 | Hollberg et al. | |
| 6,873,838 B2 | 3/2005 | Mapes | |
| 7,437,253 B2 | 10/2008 | Shcheglov et al. | |
| 9,038,459 B1 | 5/2015 | Kubena | |
| 2004/0134278 A1 | 7/2004 | Fell et al. | |
| 2005/0092084 A1 | 5/2005 | Fell et al. | |

(Continued)

OTHER PUBLICATIONS

U.S. Appl. No. 15/253,704, filed Aug. 31, 2016, Sorenson et al.

(Continued)

*Primary Examiner* — Lina M Cordero
(74) *Attorney, Agent, or Firm* — Lewis Roca Rothgerber Christie, LLP

(57) ABSTRACT

A sensor includes an acceleration or magnetic field sensitive microelectromechanical systems (MEMS) resonator, configured to oscillate in at least a first normal mode and a second normal mode. The sensor further includes: a coarse readout circuit configured to drive the first normal mode, measure a motion of the first normal mode, and derive from the measured motion a coarse measurement of the true acceleration or true external magnetic field; and a fine readout circuit configured to drive the second normal mode, measure a motion of the second normal mode, and derive from the measured motion and the coarse measurement a measurement of the difference between the true acceleration or true external magnetic field and the coarse measurement.

3 Claims, 9 Drawing Sheets

(56) References Cited

U.S. PATENT DOCUMENTS

| | | |
|---|---|---|
| 2005/0257596 A1 | 11/2005 | Fell et al. |
| 2006/0266116 A1* | 11/2006 | Chikovani ......... G01C 19/5691 |
| | | 73/504.02 |
| 2013/0268227 A1 | 10/2013 | Opris et al. |
| 2014/0000365 A1 | 1/2014 | Aaltonen |
| 2014/0000366 A1 | 1/2014 | Blomqvist |
| 2014/0230547 A1 | 8/2014 | El-Gamal et al. |
| 2014/0260611 A1* | 9/2014 | Johari-Galle ...... G01C 19/5677 |
| | | 73/504.12 |
| 2014/0260614 A1 | 9/2014 | Bhave et al. |
| 2015/0000401 A1 | 1/2015 | Perahia et al. |
| 2016/0003618 A1 | 1/2016 | Boser et al. |
| 2016/0109258 A1 | 4/2016 | Boser et al. |
| 2016/0139176 A1 | 5/2016 | Shirazi et al. |

OTHER PUBLICATIONS

"Leading Edge Technology Enables a Chip Scale Atomic Clock", Microsemi Corporation, 2014, pp. 1-6.

Lutwak, R. et al., "The Chip-Scale Atomic Clock—Recent Development Progress", Proceedings of the 35th Annual Precise Time and Time Interval (PTTI) Systems and Applications Meeting, Dec. 2-4, 2003, pp. 467-478, San Diego, California.

Website: Quantum SA.45s Chip Scale Atomic Clock (CSAC); Microsemi Corporation http://www.microsemi.com/products/timing-synchronization-systems/embedded-timing-solutions/components/sa-45s-chip-scale-atomic-clock#overview, printed Nov. 10, 2016, (2 pages).

\* cited by examiner

HIGH DYNAMIC RANGE GYROSCOPE

CROSS-REFERENCE TO RELATED APPLICATION(S)

The present application is a divisional of U.S. patent application Ser. No. 16/277,610, filed on Feb. 15, 2019, which is a divisional of U.S. patent application Ser. No. 15/253,694, filed on Aug. 31, 2016, which claims priority to and the benefit of U.S. Provisional Application No. 62/212, 902, filed Sep. 1, 2015, entitled "ATOM LOCKED ANGULAR SENSOR (ATLAS) WITH HIGH RESOLUTION AND DYNAMIC RANGE MULTI-MODE GYRO (MMG) ARCHITECTURE", and priority to and the benefit of U.S. Provisional Application No. 62/321,042, filed Apr. 11, 2016, entitled "STABILIZATION OF CORIOLIS VIBRATORY GYROSCOPES BY FREQUENCY LOCKING TO ULTRA STABLE CLOCKS", the entire contents of all of which are incorporated herein by reference.

FIELD

One or more aspects of embodiments according to the present invention relate to angular sensors, and more particularly to an angular sensor with high dynamic range.

BACKGROUND

Gyroscopes may be used in a wide range of applications, including guidance of aircraft, spacecraft, missiles, and the like. A gyroscope (or "gyro") measures an angular rate, i.e., the rate at which the gyroscope rotates, about one or more axes. The output of a gyroscope may be a digital data stream. The rate resolution of the gyro, i.e., the ability of the gyro to detect low angular rates or small changes in angular rate, may be limited in part by the resolution (i.e., the number of bits) and scale factor of an analog to digital converter (ADC) that may be part of a signal chain connecting a physical sensing element to a digital output of the gyro. The range of the gyro, i.e., the maximum angular rate that it is capable of measuring, may also be related to the resolution and the scale factor of the ADC. As such, a gyro designed to operate at high angular rates may have relatively poor resolution, and a high-resolution gyro may have relatively limited range. Some applications, however, may require a gyro having both high range, e.g., in aircraft or missiles designed to be highly maneuverable, and fine resolution, to provide accurate guidance.

Thus, there is a need for a gyro with high dynamic range, i.e., with high rate resolution and high range.

SUMMARY

According to an embodiment of the present invention there is provided an angular sensor, including: a Coriolis vibratory gyroscope (CVG) resonator, configured to oscillate in: a first pair of normal modes including a first normal mode and a second normal mode; and a second pair of normal modes including a third normal mode and a fourth normal mode, a coarse readout circuit configured to: drive the first pair of modes, measure motion of the first pair of modes, and derive from the measured motion of the first pair of modes a coarse measurement of a true angular rate of the CVG resonator; and a fine readout circuit configured to: receive the coarse measurement, drive the second pair of modes, measure motion of the second pair of modes, and derive, from: the measured motion of the second pair of modes, and the received coarse measurement, a measurement of the difference between the true angular rate of the CVG resonator and the coarse measurement.

In one embodiment, the fine readout circuit is configured to drive the third normal mode at a first drive frequency and to drive fourth normal mode at a second drive frequency, and wherein the fine readout circuit is configured to derive the measurement of the difference between the true angular rate of the CVG resonator and the coarse measurement by adjusting the first drive frequency and the second drive frequency so that the difference between the first drive frequency and the second drive frequency is proportional to the coarse measurement.

In one embodiment, the fine readout circuit is configured to derive the measurement of the difference between the true angular rate of the CVG resonator and the coarse measurement by adjusting a natural frequency of the third normal mode and a natural frequency of fourth normal mode so that the difference between the natural frequency of the third normal mode and the natural frequency of the fourth normal mode is proportional to the coarse measurement.

In one embodiment, the fine readout circuit is configured to adjust the natural frequency of the third normal mode by adjusting a bias voltage applied to a tuning electrode coupled to the third normal mode.

In one embodiment, the fine readout circuit includes: a second transimpedance amplifier configured to measure a displacement in the fourth normal mode; an analog summing circuit connected to an output of the second transimpedance amplifier; a modulator block configured to generate a waveform that is the opposite of the waveform expected at the output of the second transimpedance amplifier when the angular sensor is rotating at a rate indicated by the coarse measurement; and a digital to analog converter connected to an output of the modulator block, and wherein the analog summing circuit is configured to add the output of the digital to analog converter to the output of the second transimpedance amplifier.

In one embodiment, the fine readout circuit includes: a second transimpedance amplifier configured to measure a displacement in the fourth normal mode; an analog to digital converter connected to an output of the second transimpedance amplifier; a digital summing circuit connected to an output of the analog to digital converter; and a modulator block configured to generate a waveform that is the opposite of the waveform expected at the output of the analog to digital converter when the angular sensor is rotating at a rate indicated by the coarse measurement; and wherein the digital summing circuit is configured to add the output of the modulator block to the output of the analog to digital converter.

In one embodiment, the fine readout circuit is configured to generate the measurement of the difference between the true angular rate of the CVG resonator and the coarse measurement with a resolution of 19 bits.

In one embodiment, the coarse readout circuit is configured to generate the measurement of the difference between the true angular rate of the CVG resonator and the coarse measurement with a resolution of 19 bits.

In one embodiment, the coarse readout circuit is configured to drive the first pair of modes so that an amplitude of motion of first normal mode is about 10 times an amplitude of motion of the second normal mode.

In one embodiment, the coarse readout circuit is configured to drive the first pair of modes so that a phase of motion of first normal mode is about 90 degrees different from a phase of motion of the second normal mode.

In one embodiment, the fine readout circuit is configured to drive the second pair of modes so that an amplitude of motion of the third normal mode is about 10 times an amplitude of motion of the fourth normal mode.

In one embodiment, the fine readout circuit is configured to drive the second pair of modes so that a phase of motion of the third normal mode is about 90 degrees different from a phase of motion of the fourth normal mode.

In one embodiment, each of the first pair of modes has a mode number of 3 and each of the second pair of modes has a mode number of 2.

In one embodiment, each of the first pair of modes has a mode number of 2 and each of the second pair of modes has a mode number of 3.

In one embodiment, the fine readout circuit is configured to drive the third normal mode at a first drive frequency and to drive the fourth normal mode at a second drive frequency, and wherein the fine readout circuit is configured to derive the measurement of the difference between the true angular rate of the CVG resonator and the coarse measurement by adjusting the first drive frequency and the second drive frequency so that the difference between the first drive frequency and the second drive frequency is proportional to the coarse measurement.

In one embodiment, the fine readout circuit is configured to derive the measurement of the difference between the true angular rate of the CVG resonator and the coarse measurement by adjusting a natural frequency of the third normal mode and a natural frequency of the fourth normal mode so that the difference between the natural frequency of the third normal mode and the natural frequency of the fourth normal mode is proportional to the coarse measurement.

In one embodiment, the fine readout circuit is configured to adjust the natural frequency of the third normal mode by adjusting a bias voltage applied to a tuning electrode coupled to the third normal mode.

According to an embodiment of the present invention there is provided a method for operating an angular sensor including a coarse readout circuit configured with a coarse scale factor and a fine readout circuit configured with a fine scale factor, greater than the coarse scale factor, the method including: generating a coarse measurement of an angular rate of the angular sensor using the coarse readout circuit, and measuring, with the fine readout circuit, the difference between the true angular rate of the angular sensor and the coarse measurement.

In one embodiment, the measuring, with the fine readout circuit, of the difference between the true angular rate of the angular sensor and the coarse measurement includes adjusting a drive frequency of a mode of a Coriolis vibratory gyroscope resonator of the angular sensor by an amount proportional to the coarse measurement.

In one embodiment, the angular sensor includes a mechanical tilt stage with two rotational degrees of freedom, wherein: the CVG resonator is secured to the tilt stage, and the coarse readout circuit is configured to generate a control signal proportional to the coarse measurement of the true angular rate of the CVG resonator and apply the control signal to the mechanical tilt stage to reduce the rotation of the tilt stage.

In one embodiment, the measuring, with the fine readout circuit, of the difference between the true angular rate of the angular sensor and the coarse measurement includes adjusting the rate of precession of a 2 degree of freedom mechanical tilt stage by an amount proportional to the coarse measurement.

According to an embodiment of the present invention there is provided a sensor including: an acceleration or magnetic field sensitive microelectromechanical systems (MEMS) resonator, configured to oscillate in at least a first normal mode and a second normal mode, a coarse readout circuit configured to: drive the first normal mode, measure a motion of the first normal mode, and derive from the measured motion a coarse measurement of the true acceleration or true external magnetic field; and a fine readout circuit configured to: drive the second normal mode, measure a motion of the second normal mode, and derive from the measured motion and the coarse measurement a measurement of the difference between the true acceleration or true external magnetic field and the coarse measurement.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a high dynamic range gyroscope provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
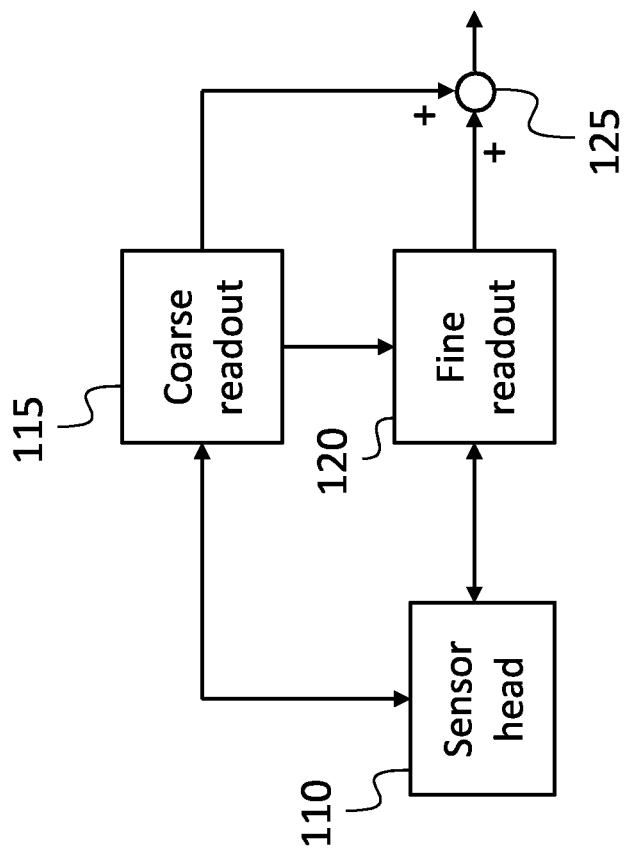
FIG. 1 is a block diagram of a high dynamic range gyroscope, according to an embodiment of the present invention.

Referring to FIG. 1, in one embodiment a Coriolis vibratory gyroscope (CVG) includes a sensor head 110, a coarse readout circuit 115, a fine readout circuit 120 and a summing circuit 125. The sensor head includes a resonator, such as a disk resonator, one or more actuators for applying force to the resonator, and one or more sensors for sensing the displacement or deformation of the resonator in response to applied forces and in response to any rotation of the CVG. In one embodiment the actuators are pairs of parallel, closely spaced electrodes, each pair having the configuration of a parallel-plate capacitor. One electrode of each pair may be on the resonator, and the other electrode of the pair may be secured, for example, to the housing of the CVG, so that when a voltage is applied across the electrodes, an electric field forms between the electrodes producing an attractive electric force between them. The same or similar electrodes may also be used to detect the displacement of a portion of the resonator with respect to the housing. For example, if a DC voltage is applied to a pair of electrodes, then the change in capacitance resulting from a change in separation between the electrodes may cause a current to flow onto one electrode of the pair and an equal current to flow away from the other electrode of the pair. Such a current may be amplified and converted to a voltage, for example, with a transimpedance amplifier (TIA).

As described in further detail below, the resonator may oscillate in various normal modes, and rotation of the resonator may cause energy to couple from one normal mode into another. This coupling may be measured and used to infer the angular rate of the CVG.

Figure 2:
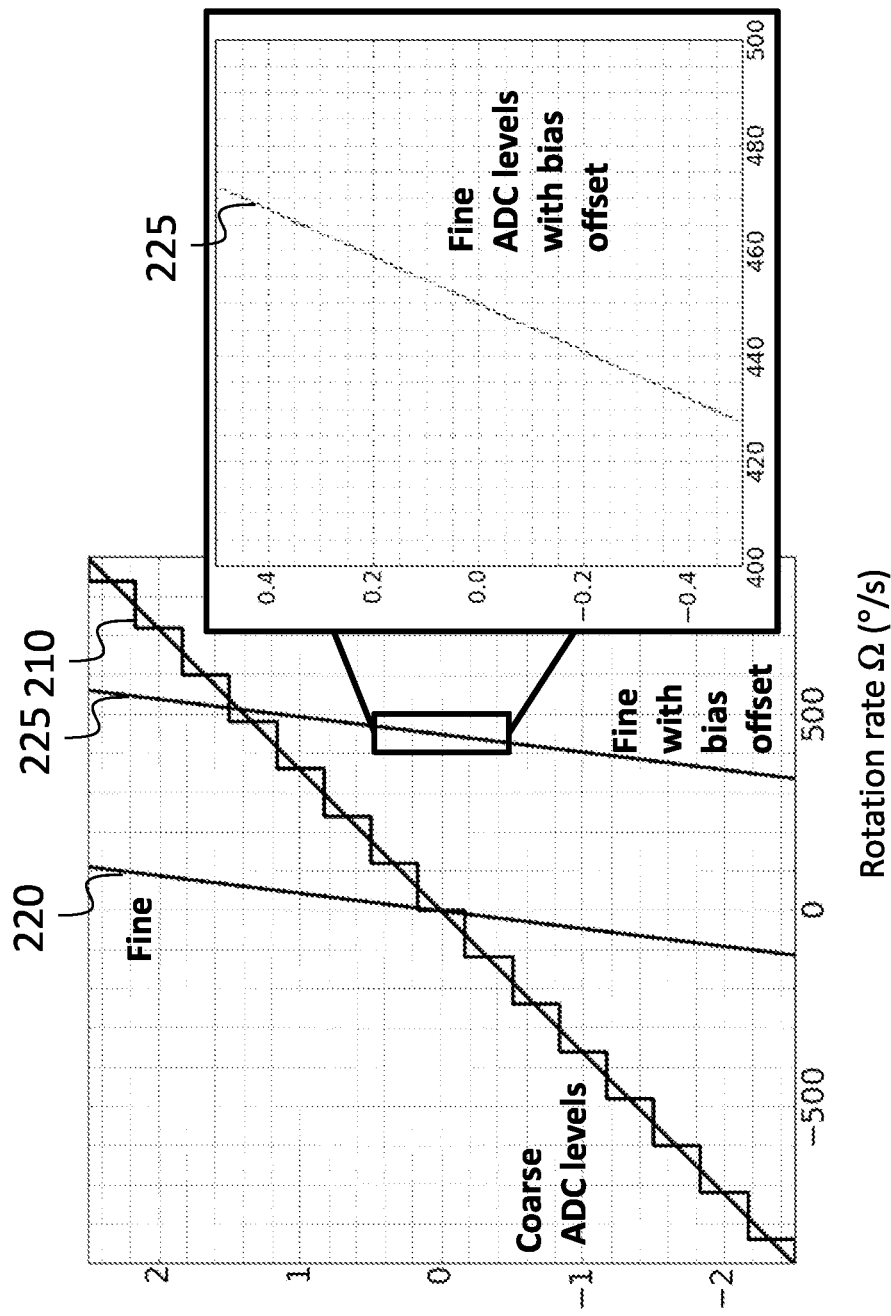
FIG. 2 is a graph, including an enlarged view inset, of a coarse output and a fine output of a high dynamic range gyroscope as a function of angular rate, according to an embodiment of the present invention.

Referring to FIG. 2, in one embodiment, the coarse readout circuit 115 senses the angular rate with a relatively small scale factor. Curve 210 shows the output of the coarse readout circuit as a function of rotation rate. For example, the coarse readout circuit may generate a 19-bit data stream, each 19-bit number in the data stream representing the instantaneous angular rate of the CVG, with a proportionality factor or "scale factor" equal to $2^{18}$ (the 19$^{th}$ bit being a sign bit) divided by the maximum measurable rate. For example, $2^{18}$ being 262,144, for a CVG capable of measuring a maximum angular rate of ±900 degrees per second, the scale factor may be 262,144/900=291.3 bits per degrees per second and the rate resolution is 900/262,144=0.0034 degrees per second. In some embodiments the coarse readout circuit includes 24-bit analog-to-digital and digital-to-analog converters, which may have inherent noise, so that the effective number of bits may be 19 or 20 bits. FIG. 2 shows a lower resolution, 4-bit ADC for clarity, so that the 16 ADC output levels corresponding to the possible 4-bit numbers are discernible.

The output of the coarse readout circuit 115 is fed to the fine readout circuit 120 as an offset or bias adjustment, so that the output range of the fine readout circuit 120 is significantly smaller, and a larger scale factor may be used. For example, if the difference between the angular rate and the digital representation of the angular rate at the output of the coarse readout circuit 115 is one-half bit of the coarse readout circuit output (i.e., one half of 0.0034 degrees per second), then the residual angular rate measured by the fine readout circuit 120 may be ±0.0034/2 degrees per second, i.e., ±0.0017 degrees per second. Accordingly, the scale factor of the fine readout circuit 120 may be selected to be significantly greater than the scale factor of the coarse readout circuit 115. For example, if the fine readout circuit 120 also generates a 19-bit data stream, each 19-bit number in the data stream representing the residual instantaneous angular rate of the CVG (after subtraction of the coarse readout circuit offset), then the resolution of the fine readout circuit 120 may be 0.0017 degrees per second divided by $2^{18}$ (the 19th bit being a sign bit), i.e., $6.5 \times 10^{-9}$ degrees per second, or 24 microdegrees per hour. In FIG. 2, curve 220 shows the output of the fine readout circuit without offset subtraction, and curve 225 shows the output of the fine readout circuit with offset subtraction.

Figure 3:
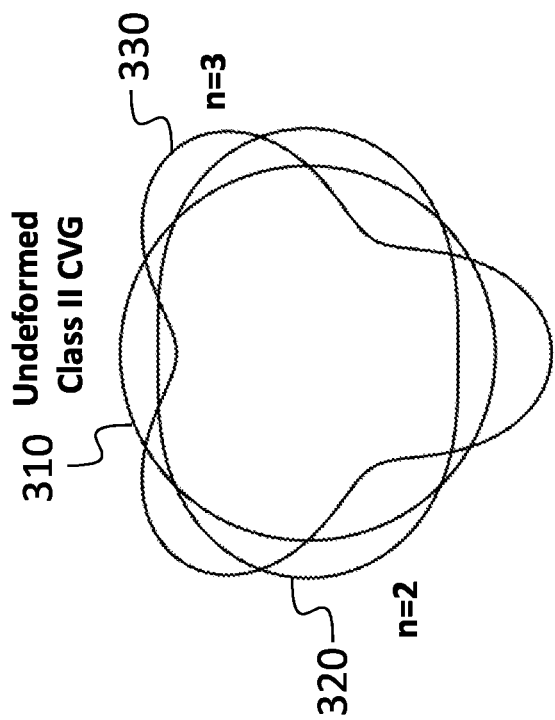
FIG. 3 is a mode pattern diagram of an n=2 mode and an n=3 mode, according to an embodiment of the present invention.

In one embodiment, a resonator configured to oscillate in two pairs of modes may be used to implement coarse and fine angular rate sensing using a single sensor head. Referring to FIG. 3, such a resonator may be a disk or other cylindrically symmetric structure and the modes may be modes (referred to as "wineglass modes") having 2-fold or 3-fold rotational symmetry as shown. In other embodiments a non-cylindrically symmetric CVG resonator (e.g., a lumped mass octagon resonator with a first pair of modes in the X and Y directions and a second pair of modes rotated 45 degrees relative to the first) may be used. The modes with 2-fold rotational symmetry may have a mode number of 2 and may accordingly be referred to as n=2 modes, and the modes with 3-fold rotational symmetry may have a mode number of 3 and may accordingly be referred to as n=3 modes. Each mode number may correspond to a family of nominally degenerate modes, i.e., modes that would be perfectly degenerate (i.e., that would have the same natural frequency) if the resonator shape and boundary conditions had perfect cylindrical symmetry. FIG. 3 shows an undeformed resonator 310, along with the shape 320 that it may take when deformed in the shape of an n=2 mode and the shape 330 that it may take when deformed in the shape of an n=3 mode.

Figure 4:
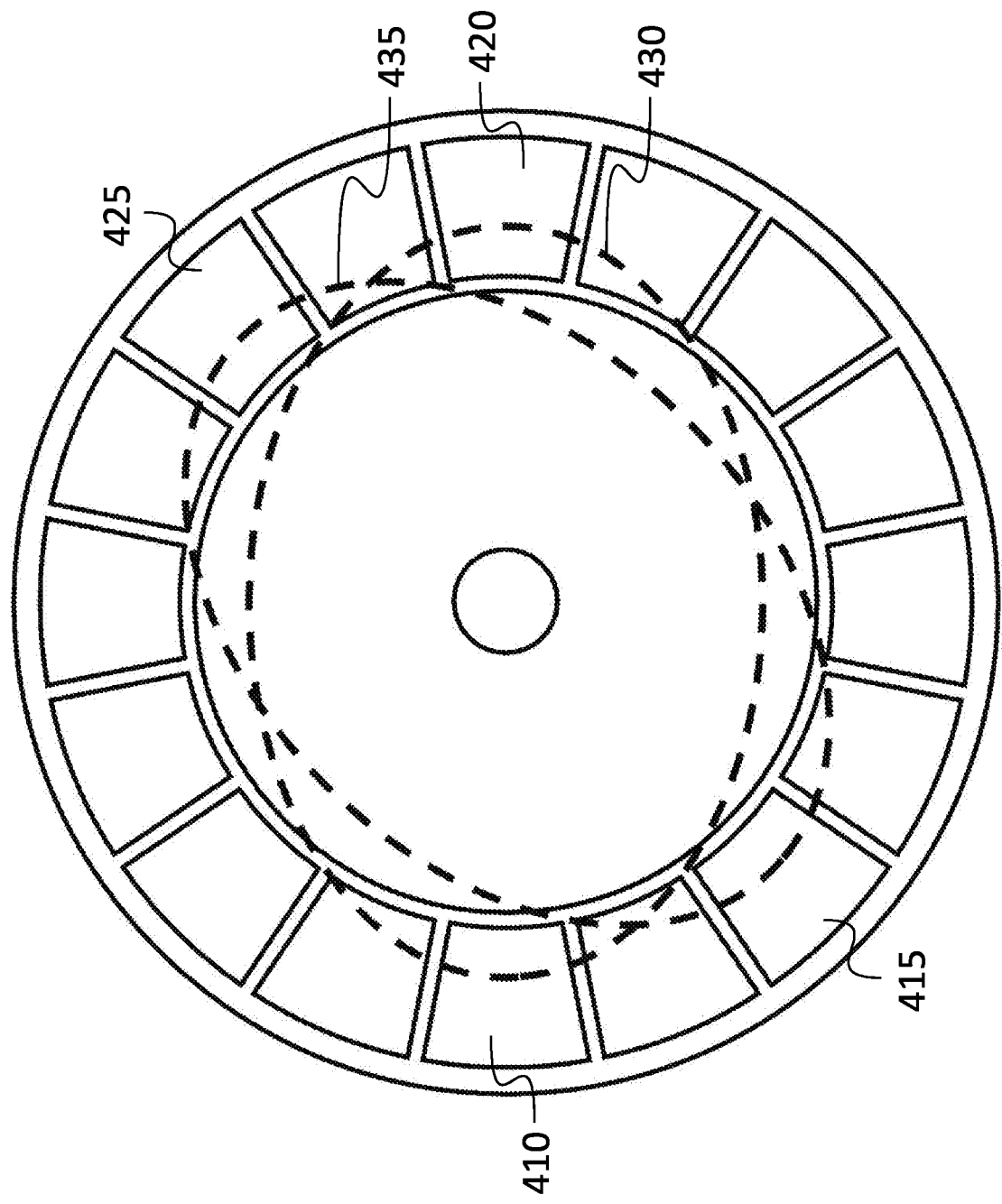
FIG. 4 is an illustration of a disk resonator, according to an embodiment of the present invention.

The coarse readout circuit 115 may use a pair of degenerate modes (e.g. a pair of n=2 modes) to generate the coarse angular rate signal. For example, referring to FIG. 4, the resonator may have 16 electrodes including a first drive electrode 410, a second drive electrode 415, a first sense electrode 420, and a second sense electrode 425. A first n=2 mode having a first mode shape 430 may be driven by the first drive electrode 410 and sensed by the first sense electrode 420, and a second n=2 mode having a second mode shape 435 may be driven by the second drive electrode 415 and sensed by the second electrode 425. In other embodiments, the resonator may have a different number of electrodes, e.g., 24 electrodes. In some embodiments more than one electrode may be driven simultaneously or concurrently to drive a particular mode, and/or more than one electrode may be sensed simultaneously or concurrently to sense displacement in a particular mode.

Figure 5:
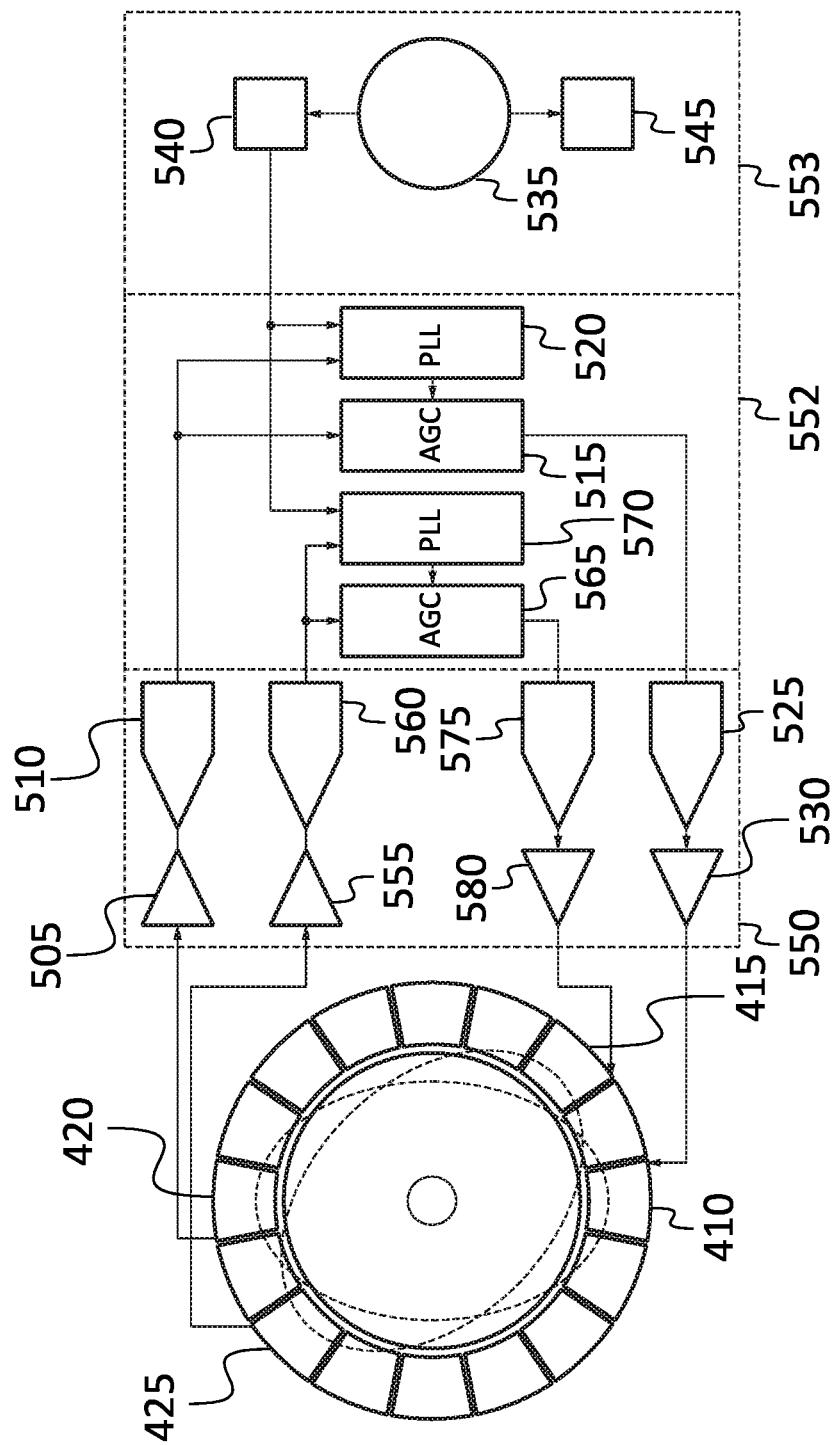
FIG. 5 is a block diagram of a high dynamic range gyroscope, according to an embodiment of the present invention.

Referring to FIG. 5, in one embodiment the resonator may be outfitted with a first sense electrode 420 and a first drive electrode 410, coupled to the first mode of the resonator. A first control loop for controlling the oscillation of the first mode may include a first transimpedance amplifier (TIA) 505 connected to the first sense electrode 420, a first analog to digital converter 510, a first automatic gain control block 515, a first phase locked loop block 520, a first digital to analog converter 525, and a first driver 530. The first transimpedance amplifier 505, the first analog to digital converter 510, the first digital to analog converter 525, and the first driver 530 may be part of a digital to analog conversion and analog signal conditioning circuit 550. The first automatic gain control block 515 and the first phase locked loop block 520 may be part of a digital control and synthesis circuit 552, which may be an entirely digital circuit implemented, for example, in a field-programmable gate array (FPGA). The frequency reference 553 may include a first stable frequency reference 535 (such as a rubidium atomic clock or a chip-scale atomic clock) operating at a relatively high internal frequency, e.g., 10 MHz. A frequency divider 540 may divide the frequency down to a frequency, at the output of the frequency reference 553, that is near the natural frequencies of the first and second normal modes, e.g., 20 kHz. The frequency reference 553 may also include a reference voltage generator 545 that takes the stable frequency provided by the frequency reference 535 and converts it into a stable reference voltage. In operation, the first mode may, in response to drive signals applied by the first control loop, oscillate at the frequency reference output frequency, e.g., 20 kHz. In one embodiment, the first TIA 505 generates a signal proportional to the displacement of the disk in the first mode, and the first analog to digital converter 510 generates from it a digital data stream representing the displacement of the disk in the first mode. The first automatic gain control block 515 measures the amplitude of the motion, compares it to a target (or "setpoint") value (e.g., a pre-programmed operating amplitude), generates an amplitude error signal proportional to the difference between the amplitude of the motion and the target, and generates an amplitude correction signal from the amplitude error signal. The amplitude correction signal may be generated, for example, by processing the amplitude error signal with a proportional-integral-differential (PID) controller. In some embodiments, the first stable frequency reference 535 is shared by multiple sensor systems, e.g., it is shared by three gyroscopes that are combined to form a three-axis gyroscope.

In other embodiments, the system may operate without a high-stability external frequency reference (which may result in a loss of performance and a reduction in cost), or without any external frequency reference. In the latter case one of the CVG modes may be used as the resonator for an oscillator; for example, the signal from a sense electrode sensing the first mode or the second mode may be fed back to a drive electrode driving the same mode, so that the loop gain exceeds one in a frequency interval around the natural frequency of the mode and with a phase that results in instability (i.e., oscillation at the frequency of a right-half-plane pole created by the feedback). A point in this loop (e.g., the output of a TIA or the output of a driver) may then be used (instead of the output of the frequency reference 553) as the source of the frequency reference signal used for both modes.

In a parallel path, the output from the first analog to digital converter 510 may also be processed by the first phase locked loop block 520 to measure the phase error of the displacement of the CVG in the first mode, and to generate a corresponding correction signal and sinusoidal drive signal. For example, the first phase locked loop block 520 may control the phase of the displacement of the disk in the first mode to be substantially in phase with the frequency reference output signal as follows. The first phase locked loop block 520 may generate a phase-shifted signal 90 degrees out of phase with frequency reference output signal, multiply this phase-shifted signal with the measured displacement in the first mode, and process the result with a low-pass filter, e.g., the loop filter in the PLL. The DC component of the product of the measured displacement and the phase-shifted sinusoidal signal will be zero if the measured displacement in the first mode is perfectly in phase with the frequency reference output signal, and it will be non-zero and proportional to the phase error (for a small phase error) when the measured displacement in the first mode is not perfectly in phase with the frequency reference output signal. In other embodiments, the relative phase of the measured displacement in the first mode and the frequency reference output signal may be measured using other methods, e.g., by fitting each with a linear combination of a sine function and a cosine function. A phase error may then be calculated by taking the difference between (i) the phase difference between the measured displacement in the first mode and the frequency reference output signal and (ii) a first phase target (i.e., a target phase difference or "phase setpoint"). Once a phase error has been calculated, a phase correction signal may be generated from the phase error by processing the phase error with a PID controller, either in the phase locked loop block 520 or in the first automatic gain control block 515.

The automatic gain control block 515 may then generate a digital drive signal, that tends to reduce the amplitude error and the phase error, from the amplitude correction signal, the phase correction signal, the phase-shifted signal and the frequency reference output signal. This drive signal may have an amplitude proportional to the amplitude correction signal (or proportional to the amplitude correction signal plus a constant offset) and a phase set by the phase correction signal. For example, when the phase error is zero, the phase of the drive signal may be zero (i.e., it may produce a force that leads the displacement by 90 degrees), and when the phase error is not zero, the phase of the drive signal may be proportional to the phase correction signal. Similarly, the amplitude of the drive signal, when the amplitude error is zero, may be just sufficient to counteract mechanical loss in the resonator, so that the amplitude of the motion in the first mode remains constant. When the amplitude correction signal is positive, the amplitude of the drive signal may be greater, and when the amplitude correction signal is negative, the amplitude of the drive signal may be smaller. The drive signal may be applied to the first drive electrode 410, to produce a corresponding force on the resonator.

A second control loop for controlling the oscillation of the second mode may similarly include a second transimpedance amplifier 555 (TIA), a second analog to digital converter 560, a second automatic gain control block 565, a second phase locked loop block 570, a second digital to analog converter 575, and a second driver 580. The amplitude and phase of the displacement in the second mode may be controlled in an analogous manner to have a particular amplitude and a particular phase relative to the output of the frequency reference 553. In one embodiment the second mode is controlled to oscillate with a phase that is 90 degrees different from that of the first mode (i.e., the oscillation of the second mode is locked to a second phase target that differs by 90 degrees from the first phase target) and with an amplitude that is about 10% of that of the first mode. When the CVG rotates, energy couples from the first mode into the second mode with a phase that is 90 degrees out of phase with the nominal oscillation of the second mode, resulting in a phase error in the second mode that is then suppressed by the second control loop. The rate of rotation (if any) may then be inferred from the phase error signal or by the phase correction signal in the second loop.

Figure 6:
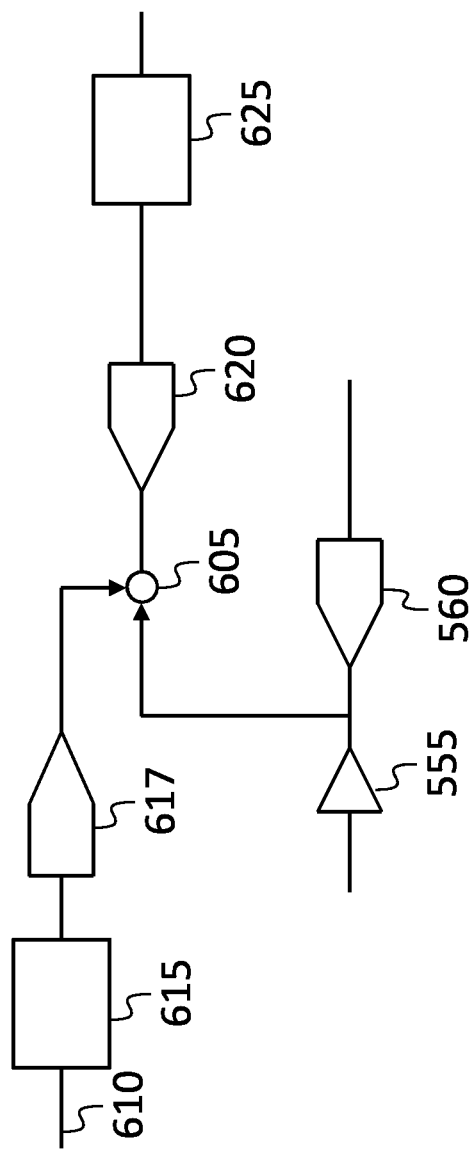
FIG. 6 is a block diagram of a system for introducing an offset from a coarse readout circuit into a fine readout circuit, according to an embodiment of the present invention.

The angular rate output from the coarse readout circuit 115 may, as mentioned above, be a digital data stream, with each number in the data stream representing the instantaneous angular rate of the CVG. Any of several configurations may be employed to feed this data stream into the fine readout circuit 120, to enable the fine readout circuit 120 to operate at higher resolution. Referring to FIG. 6, in one embodiment, in the fine readout circuit (e.g., the n=3 readout circuit) the output of the second transimpedance amplifier 555 may be connected both to the second analog to digital converter 560 and to a summing circuit 605. The output of the coarse readout circuit 115 may be connected to coarse signal input 610, modified by modulator block 615, converted to an analog signal by an analog to digital converter 617, and fed into the summing circuit 605. The modulator block may be configured to generate, at its output, a waveform that is the opposite of the waveform expected at the output of the second transimpedance amplifier 555 when the CVG is rotating at the rate indicated by the coarse signal. In this manner, when the output of the modulator block 615 and the output of the second transimpedance amplifier 555 are summed in the summing circuit 605, the output of the summing circuit 605 is small, representing only the residual of the rotation measured in the fine readout circuit 120 after the signal from the coarse readout circuit 115 has been subtracted. The output of the summing circuit 605 is then fed to a third analog to digital converter 620, and to a fine signal processing block 625. The gain or scale factor of the third analog to digital converter 620 may be selected to be relatively large, so that the relatively small signal at the output of the summing circuit 605 may span the entire range, or nearly the entire range, of the third analog to digital converter 620, and, accordingly, the resolution of the third analog to digital converter 620 may be relatively high compared to the resolution of the second analog to digital converter of the coarse readout circuit. The fine signal processing block 625 may then infer the fine component of the angular rate from the output of the third analog to digital converter 620.

Figure 7:
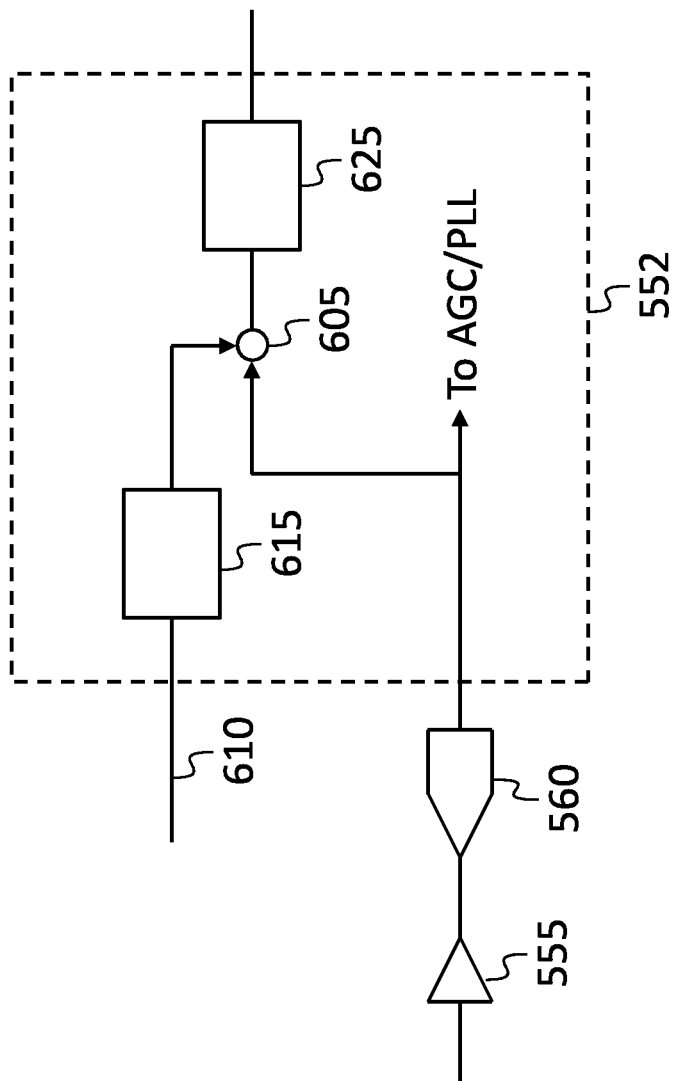
FIG. 7 is a block diagram of a system for introducing an offset from a coarse readout circuit into a fine readout circuit, according to another embodiment of the present invention.

Referring to FIG. 7, in another embodiment, similar processing may be performed entirely in the digital domain as shown. In this embodiment, the digital output signal from the coarse readout circuit 115 is fed into the digital control and synthesis circuit 552, within which it is sent to the second automatic gain control block 565 and to the second phase locked loop block 570 (not shown in FIG. 7), and also to a summing circuit 605, which in the embodiment of FIG. 7 is a digital summing circuit. As in the embodiment of FIG. 6, the modulator block 615 is configured to generate, at its output, a waveform that is the opposite of the waveform expected at the output of the second transimpedance amplifier 555 when the CVG is rotating at the rate indicated by the coarse signal. In this manner, when the output of the modulator block 615 and the output of the second transimpedance amplifier 555 are summed in the summing circuit 605, the output of the summing circuit 605 is small, representing only the residual of the rotation measured in the fine readout circuit 120 after the signal from the coarse readout circuit 115 has been subtracted.

Figure 8:
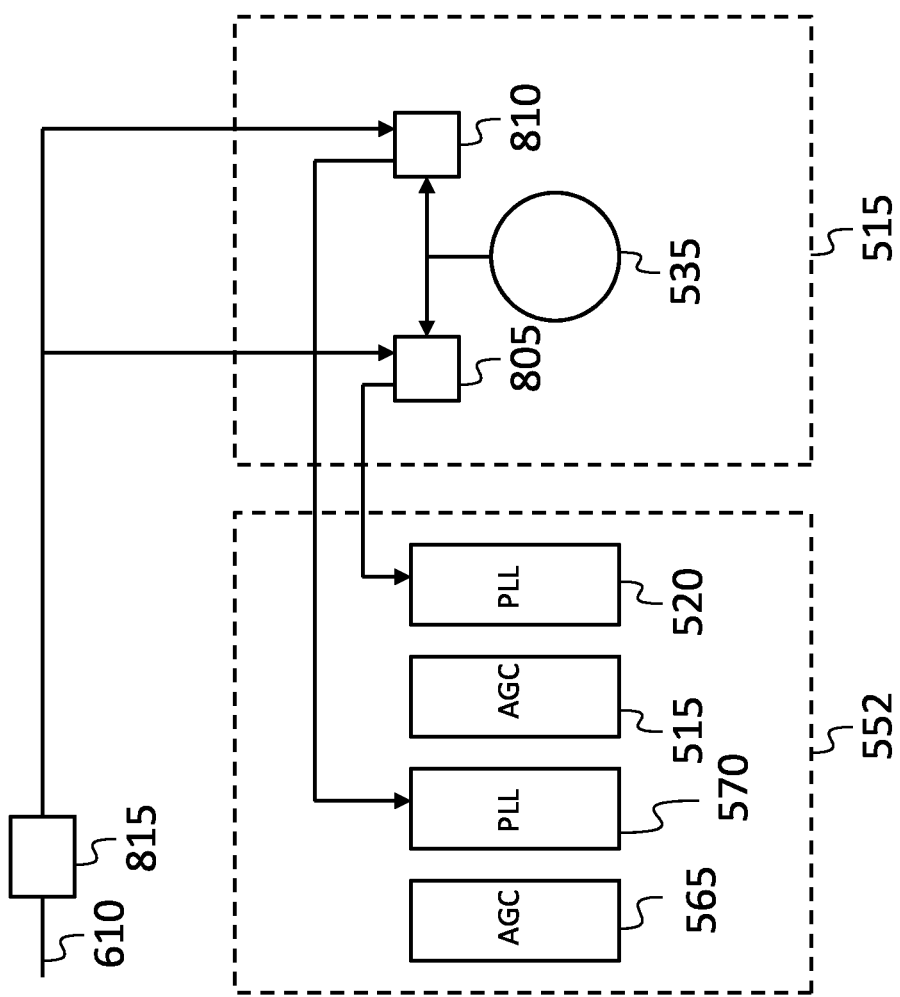
FIG. 8 is a block diagram of a system for introducing an offset from a coarse readout circuit into a fine readout circuit, according to another embodiment of the present invention.

Referring to FIG. 8, in a third embodiment, the signal from the coarse readout circuit 115 is used to generate an offsetting bias in the fine readout circuit 120 by causing the first and second modes of the pair of modes used by the fine readout circuit 120 to oscillate at different frequencies. This frequency difference may result in a bias, in the fine readout circuit 120, proportional to the frequency difference.

The frequency difference may be produced, for example, by splitting the signal from the first stable frequency reference 535 to two dividers 805, 810 that generate different reference frequency signals for the first and second modes of the fine readout circuit 120. In one embodiment a frequency setting circuit 815 receives the output signal of the coarse readout circuit 115 and calculates from it a selected pair of frequencies that, when provided to the control circuits for the first and second modes of the fine readout circuit 120, results in a bias that substantially cancels the effect of the rotation of the CVG in the fine readout circuit 120. The dividers 805, 810 may then be programmed (e.g., also by the frequency setting circuit 815, or by circuits in the respective dividers) with divider ratios that cause the dividers 805, 810 to produce, from the internal frequency, the selected frequencies.

In the embodiment of FIG. 8, the effect of introducing a bias through the adjustment of the respective drive frequencies of the two modes of the fine readout circuit 120 is that the output of the fine readout circuit 120 is confined to a substantially smaller range than the range of outputs that would be present in the absence of the offset provided by the coarse readout circuit 115; the output range of the fine readout circuit 120 may be, for example, ±0.0017 degrees per second, instead of ±900 degrees per second. This may allow the fine stage output to be measured with correspondingly finer resolution.

Figure 9:
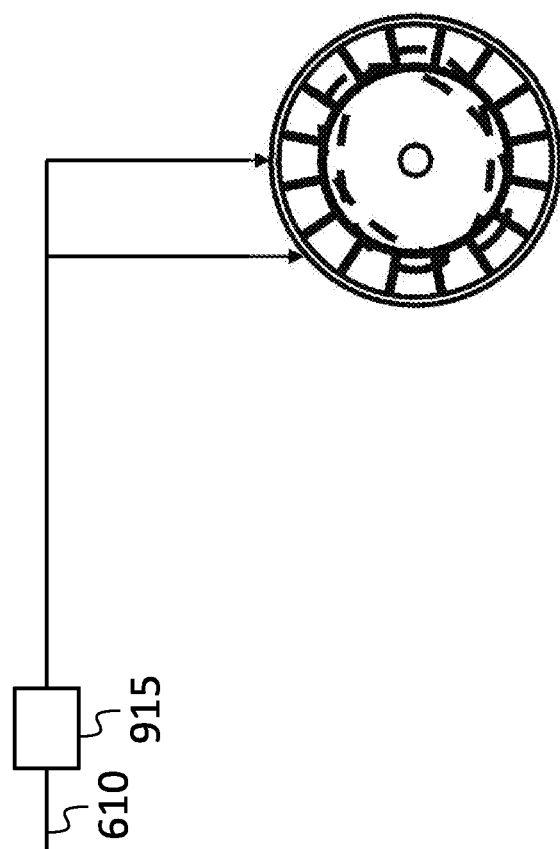
FIG. 9 is a block diagram of a system for introducing an offset from a coarse readout circuit into a fine readout circuit, according to another embodiment of the present invention.

Referring to FIG. 9, in one embodiment a bias may be introduced in the fine readout circuit 120 by adjusting the natural frequencies of the pair of modes coupled to the fine readout circuit 120. The natural frequency of any of the normal modes may be adjusted by applying a DC, or slowly varying, potential to a tuning electrode coupled to the normal mode. The tuning electrode may be a drive electrode, a sense electrode, or another electrode coupled to the normal mode. The attractive force due to a potential difference across the two electrodes may vary with the separation of the electrodes, e.g., due to fringing fields at the edges of the electrodes and because, if the potential difference is constant, the change in capacitance with separation may result in a change in the charge on the electrodes. This variation in force with distance may have the effect of an additional (negative) spring force superimposed on the mechanical internal restoring force of the resonator, so that a DC voltage applied to any pair of electrodes may affect (e.g., lower) the natural frequency of the first and/or second normal mode.

This characteristic may be used to adjust, based on the output of the coarse readout circuit 115, the natural frequency of one or both modes coupled to the fine readout circuit 120 so as to introduce a bias into the fine readout circuit 120 canceling the rotational rate measured by the coarse readout circuit 115. In one embodiment a frequency setting circuit 915 receives the output signal of the coarse readout circuit 115 and calculates from it tuning voltages that, when applied to the tuning electrodes for the first and second modes of the fine readout circuit 120, result in a bias that substantially cancels the effect of the rotation of the CVG in the fine readout circuit 120. As in the embodiment of FIG. 8, this cancellation may allow the fine stage output to be measured with significantly finer resolution.

In some embodiments the bias cancellation from the coarse readout is introduced to the fine readout through a 2DOF (or more) mechanical tilt stage controlled by the coarse readout circuit to cause the input axis of the gyro to precess in a manner opposing the coarse rotation signal. In some embodiments, a closed loop system is utilized, in which a gyro rate output is nulled and the signal strength necessary to do so is a measure of the gyro rotation rate.

The techniques of embodiments of the present invention may be applied to other sensors such as accelerometers and magnetometers, e.g., combining a coarse sensor and a fine sensor, with different scale factors, and with the coarse sensor providing an offset to the fine sensor.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Any digital circuit employed in embodiments of the present invention, such as the digital control and synthesis circuit 552, may be implemented with a processor. The term "processor" is used herein to include any combination of hardware, firmware, and software, employed to process data or digital signals. Processing unit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs).

Although exemplary embodiments of a high dynamic range gyroscope have been specifically described and illustrated herein, many modifications and variations will be apparent to those skilled in the art. For example, in some modes the coarse readout circuit 115 and the fine readout circuit 120 are connected to modes other than n=2 and n=3 modes respectively, e.g., they may be connected to n=3 and n=2 modes, respectively. Accordingly, it is to be understood that a high dynamic range gyroscope constructed according to principles of this invention may be embodied other than as specifically described herein. The invention is also defined in the following claims, and equivalents thereof.

What is claimed is:

1. A method for operating an angular sensor comprising:
   a coarse readout circuit configured with a coarse scale factor, and
   a fine readout circuit configured with a fine scale factor, greater than the coarse scale factor,
   the method comprising:
      generating a coarse measurement of a true angular rate of the angular sensor using the coarse readout circuit, and
      measuring, with the fine readout circuit, a difference between the true angular rate of the angular sensor and the coarse measurement.

2. The method of claim 1, wherein the measuring, with the fine readout circuit, of the difference between the true angular rate of the angular sensor and the coarse measurement comprises adjusting a drive frequency of a mode of a Coriolis vibratory gyroscope resonator of the angular sensor by an amount proportional to the coarse measurement.

3. The method of claim 1, wherein the measuring, with the fine readout circuit, of the difference between the true angular rate of the angular sensor and the coarse measurement comprises adjusting a rate of precession of a 2 degree of freedom mechanical tilt stage by an amount proportional to the coarse measurement.

* * * * *